United States Patent
Park et al.

(10) Patent No.: US 9,735,063 B2
(45) Date of Patent: Aug. 15, 2017

(54) METHODS FOR FORMING FIN STRUCTURES

(71) Applicant: GLOBALFOUNDRIES Inc., Grand Cayman (KY)

(72) Inventors: Chanro Park, Clifton Park, NY (US); Min Gyu Sung, Latham, NY (US); Hoon Kim, Clifton Park, NY (US); Ruilong Xie, Niskayuna, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 14 days.

(21) Appl. No.: 14/830,245

(22) Filed: Aug. 19, 2015

(65) Prior Publication Data

US 2017/0053836 A1   Feb. 23, 2017

(51) Int. Cl.
| | |
|---|---|
| *H01L 21/8238* | (2006.01) |
| *H01L 21/02* | (2006.01) |
| *H01L 21/3105* | (2006.01) |
| *H01L 29/66* | (2006.01) |
| *H01L 21/311* | (2006.01) |

(52) U.S. Cl.
CPC .. *H01L 21/823821* (2013.01); *H01L 21/0217* (2013.01); *H01L 21/02112* (2013.01); *H01L 21/02115* (2013.01); *H01L 21/02271* (2013.01); *H01L 21/31056* (2013.01); *H01L 21/31116* (2013.01); *H01L 21/823807* (2013.01); *H01L 29/66795* (2013.01)

(58) Field of Classification Search
CPC ....... H01L 21/823821; H01L 29/66795; H01L 21/31056; H01L 21/02271; H01L 21/31116; H01L 21/823807; H01L 21/02115; H01L 21/02112; H01L 21/0217
See application file for complete search history.

(56) References Cited

U.S. PATENT DOCUMENTS

| | | | | |
|---|---|---|---|---|
| 9,425,106 | B1 * | 8/2016 | Xie | H01L 21/823431 |
| 9,449,881 | B1 * | 9/2016 | Sung | H01L 21/823431 |
| 2014/0191323 | A1 * | 7/2014 | Bergendahl | H01L 21/823431 |
| | | | | 257/368 |
| 2015/0115418 | A1 | 4/2015 | Wei et al. | |
| 2015/0357439 | A1 * | 12/2015 | Liu | H01L 29/66795 |
| | | | | 257/401 |

OTHER PUBLICATIONS

Sung et al, pending U.S. Appl. No. 14/463,013, filed Aug. 19, 2014, "Methods of Fabricating Fin Structures of Uniform Height".

* cited by examiner

*Primary Examiner* — Latanya N Crawford
(74) *Attorney, Agent, or Firm* — Heslin Rothenberg Farley and Mesiti PC

(57) ABSTRACT

A method includes providing a substrate having a first and a second plurality of fins with a first at least one dielectric material disposed thereon, removing upper portions of the first dielectric material to expose upper portions of the first and the second plurality of fins, removing the first dielectric material from the lower portions of the second plurality of fins to expose lower portions of the second plurality of fins, depositing a second at least one dielectric material on at least the upper and the lower exposed portions of the second plurality of fins and on the upper exposed portions of first plurality of fins, removing the second dielectric material to expose upper portions of the first and the second plurality of fins, and wherein the first dielectric material is different from the second dielectric material. The resulting structure may be operable for use as nFETs and pFETs.

18 Claims, 11 Drawing Sheets

METHODS FOR FORMING FIN STRUCTURES

TECHNICAL FIELD

The present disclosure relates generally to circuit structures, and more particularly, methods for forming fin structures.

BACKGROUND OF THE DISCLOSURE

Fin field-effect transistor (FinFET) devices continue to be developed to replace conventional planar metal oxide semiconductor field-effect transistors (MOSFETs) in advanced complementary metal oxide semiconductor (CMOS) technology. As is known, the term "fin" refers to a generally vertically-oriented structure within or upon which are formed, for instance, one or more FinFETs or other fin devices, such as passive devices, including capacitors, diodes, etc.

There is a need for further conductive circuits and more particularly, to methods for forming fin structures.

SUMMARY OF THE DISCLOSURE

The shortcomings of the prior art are overcome and additional advantages are provided through the provision, in one aspect, of a method for use in forming a plurality of fins for nFETs and pFETs. The method includes providing an intermediate semiconductor structure having a substrate having a first and a second plurality of fins with a first at least one dielectric material disposed thereon, removing upper portions of the first at least one dielectric material to expose upper portions of the first and the second plurality of fins, removing the first at least one dielectric material from the lower portions of the second plurality of fins to expose lower portions of the second plurality of fins, depositing a second at least one dielectric material on at least the upper and the lower exposed portions of the second plurality of fins and on the upper exposed portions of first plurality of fins, removing the second at least one dielectric material to expose upper portions of the first and the second plurality of fins, and wherein the first at least one dielectric material is different from the second at least one dielectric material so that the first and the second plurality of fins are operable for use as the nFETs and the pFETs.

Another aspect if the present disclosure includes a method for use in forming a plurality of nFETs and pFETs. The method includes providing an intermediate semiconductor structure having a substrate having a first and a second plurality of fins with a first at least one dielectric material disposed thereon, depositing a first blocking material over the first and the second plurality of fins having the first at least one dielectric material disposed thereon, removing an upper portion of the first blocking material so that upper portions of the first and the second plurality of fins with the first at least one dielectric material extends above the remaining first blocking material, removing upper portions of the first at least one dielectric material disposed above the remaining first blocking material to expose upper portions of the first and the second plurality of fins, removing the remaining first blocking material, removing the first at least one dielectric material from the lower portions of the second plurality of fins to expose lower portions of the second plurality of fins, depositing a second at least one dielectric material on the upper and lower exposed portions of the second plurality of fins, and on the upper exposed portions of first plurality of fins, depositing a second blocking material over the first plurality of fins with the first at least one dielectric material disposed thereon and the second plurality of fins with the second at least one dielectric material disposed thereon, removing an upper portion of the second blocking material so that upper portions of the first plurality of fins with the second at least one dielectric material extends above the remaining second blocking material and upper portions of the second plurality of fins with the second at least one dielectric material extends above the remaining second blocking material, and removing upper portions of the second at least one dielectric material to expose upper portions of the first and second plurality of fins, wherein the first at least one dielectric material is different from the second at least one dielectric material so that the first and second plurality of fins are operable for use as the nFETs and the pFETs.

Additional features and advantages are realized through the techniques of the present disclosure. Other embodiments and aspects of the present disclosure are described in detail herein and are considered a part of the claims.

BRIEF DESCRIPTION OF THE DRAWINGS

The subject matter of the present disclosure is particularly pointed out and distinctly claimed in the concluding portion of the specification. The disclosure, however, may best be understood by reference to the following detailed description of various embodiments and the accompanying drawings in which:

DETAILED DESCRIPTION OF THE DISCLOSURE

Aspects of the present disclosure and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the disclosure in detail. It should be understood, however, that the detailed description and the specific examples, while indicating embodiments of the present disclosure, are given by way of illustration only, and are not by way of limitation. Various substitutions, modifications, additions and/or arrangements within the spirit and/or scope of the underlying concepts will be apparent to those skilled in the art from this disclosure. Reference is made below to the drawings, which are not drawn to scale for ease of understanding, wherein the same reference numbers used throughout different figures designate the same or similar components.

FIGS. 1-18 diagrammatically illustrate an exemplary embodiment of a method for use in forming a plurality of fins for nFETs and pFETs in accordance with aspects of the present disclosure. As will be appreciated, the technique of the present disclosure may allow for forming circuit structures using first and second blocking materials with the selective removal or etching of upper portions thereof along with a single lithographic patterning process employing a mask for fabrication of nFETs and pFETs. Such a process may likely be less expensive compared a process using an expensive first lithographic patterning process employing a mask (e.g., n-well patterning) and an expensive second lithographic patterning process employing a mask (e.g., p-well patterning) for fabrication of nFETs and pFETs. For example, use of a less costly first and second blocking materials with the selective removal or etching of upper portions thereof in place of one of one of more expensive lithographic patterning processes employing a mask may result in a reduction in cost for fabrication of nFETs and pFETs. The present technique may also be applicable for forming super steep retrograde wells (SSRW). In addition, such a technique of the present disclosure may also result in avoiding pinch-off at or between tight pitched fins.

Figure 1:
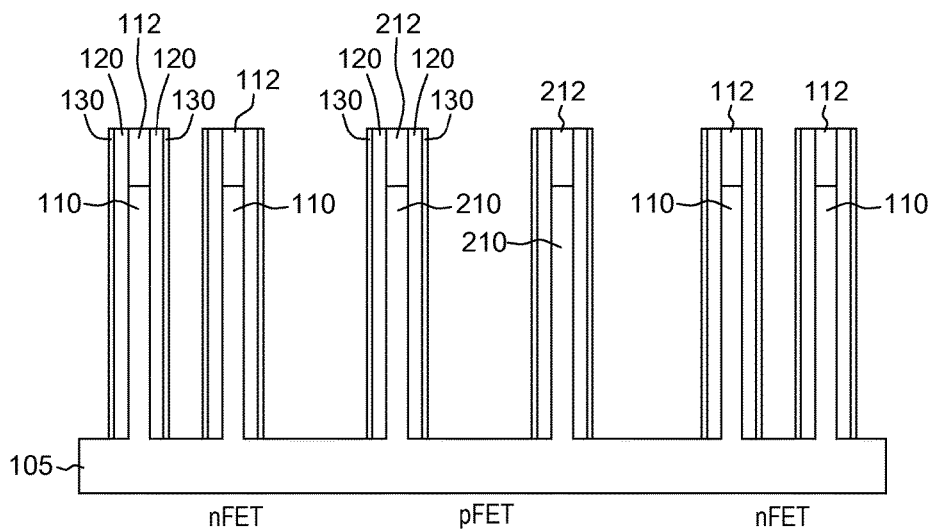
FIGS. 1-18 are cross-sectional views of intermediate circuit structures diagrammatically illustrating one embodiment of a method for use in forming a plurality of fins for nFETs and pFETs in accordance with aspects of the present disclosure.

With reference to FIG. 1, FIG. 1 depicts a cross-sectional view of a portion of one embodiment of an intermediate structure at an intermediate fabrication step. The intermediate structure may be a post fin etching and include a substrate 105 that includes a first plurality of fins 110 and a second plurality of fins 210. For example, fins 110 and 210 may, in general, be formed by applying a patterned mask 112 and 212, such as a patterned silicon nitride hard mask, over a bulk semiconductor substrate, such as a silicon wafer, and etching fins 110 and 210. Fins 110 and 210 may be the same material or may be different. Following fin etching, a first at least one dielectric material may be disposed over the fins. For example, a first dielectric material 120 may be disposed over fins 110 and 210, and a spacer or second dielectric material 130 may be disposed over the first dielectric material 120. First dielectric material may be a generally uniform conformal layer deposited by chemical vapor deposition (CVD). The first dielectric material may be a silicon oxide such as a boron silicate glass (BSG), or other suitable material. The spacer material may be applied over the exposed first dielectric material 120, by for example, atomic layer deposition (ALD). The spacer material may be made of, for example, silicon nitride (SiN). The first at least one dielectric material, e.g., first and second dielectric material 120 and 130, may then be etched back to remove the horizontal portions of the first at least one dielectric material. As described in greater detail below, in accordance with aspects of the process of the present disclosure, the first plurality of fins and the second plurality of fins may result in the formation of nFETs and pFETs, respectively.

Figure 2:
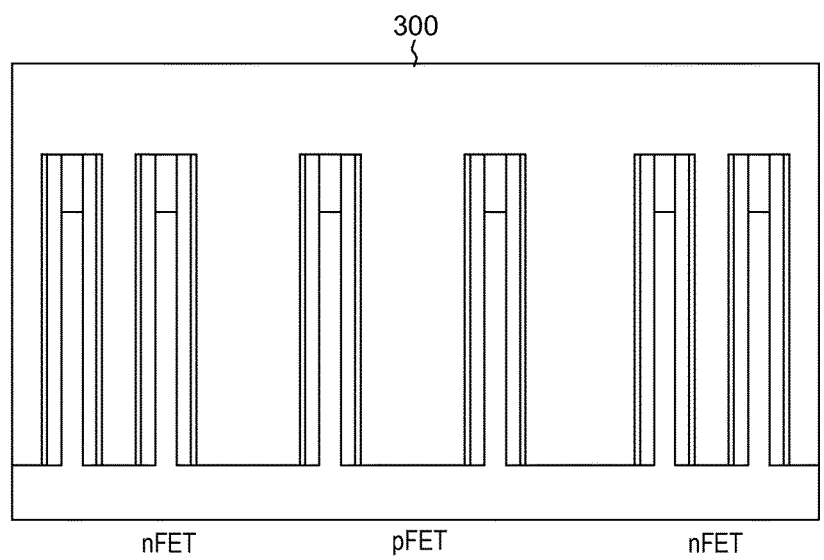
Figure 3:
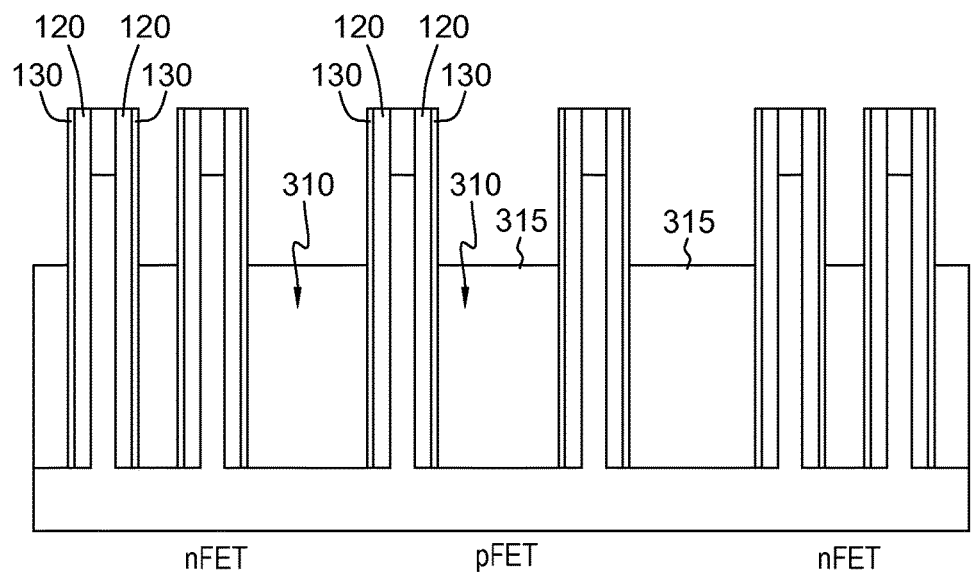
Figure 4:
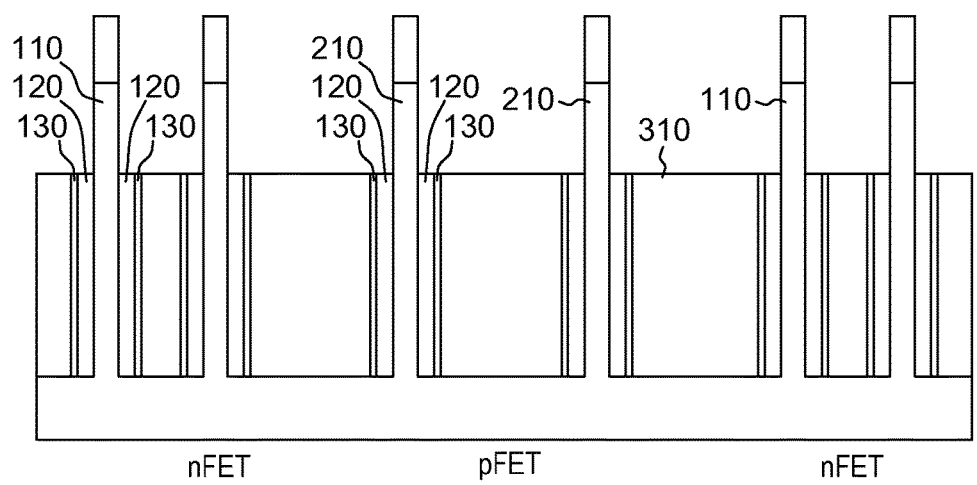
Figure 5:
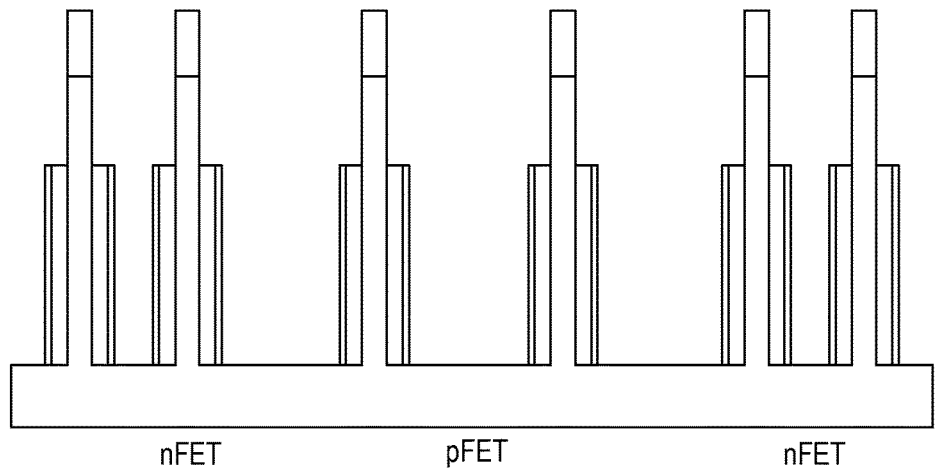

With reference to FIGS. 2-5, application of a readily applied and removed blocking material for selectively exposing upper portions of the first plurality of fins and the second plurality of fins. For example, as shown in FIG. 2, a blocking material 300 may deposited over and cover the first and second pluralities of fins having the first at least one dielectric material disposed thereon. The blocking material may include an organic planarizing layer, an amorphous carbon layer, or other suitable blocking material. Thereafter, as shown in FIG. 3, an upper portion of the blocking material may be etched back or removed leaving lower portions 310 of the blocking material and revealing or exposing upper portions of the first plurality and the second plurality of fins 110 and 120 with the first at least one dielectric materials at a desired height extending above lower portions 310 of the remaining blocking material. For example, removal of the upper portions of the blocking material may employ an organic planarization layer etch back. The blocking material may be etched back and the amount of removed may be based the amount of time employed for etching the blocking material. As described below, upper surfaces 315 of lower portions 310 of the blocking material may be used for determining the height of the resulting exposed fins for use in forming the nFETs and pFETs, and generally correspond closely to the bottom of the final exposed fin height for use in forming the nFETs and pFETs. The exposed upper portions of the first at least one dielectric materials e.g., dielectric material 120 and dielectric material 130, disposed above the lower portion of the remaining blocking material may be selectively removed as shown in FIG. 4 to expose upper portions of the first and second plurality of fins 110 and 210. For example, removal of the first at least one dielectric materials by be performed by a SiConi™ etch back process or processes, or other suitable process. Thereafter, the remaining or lower portions 310 of the blocking material is stripped or removed as shown in FIG. 5, for example, by etching.

Figure 6:
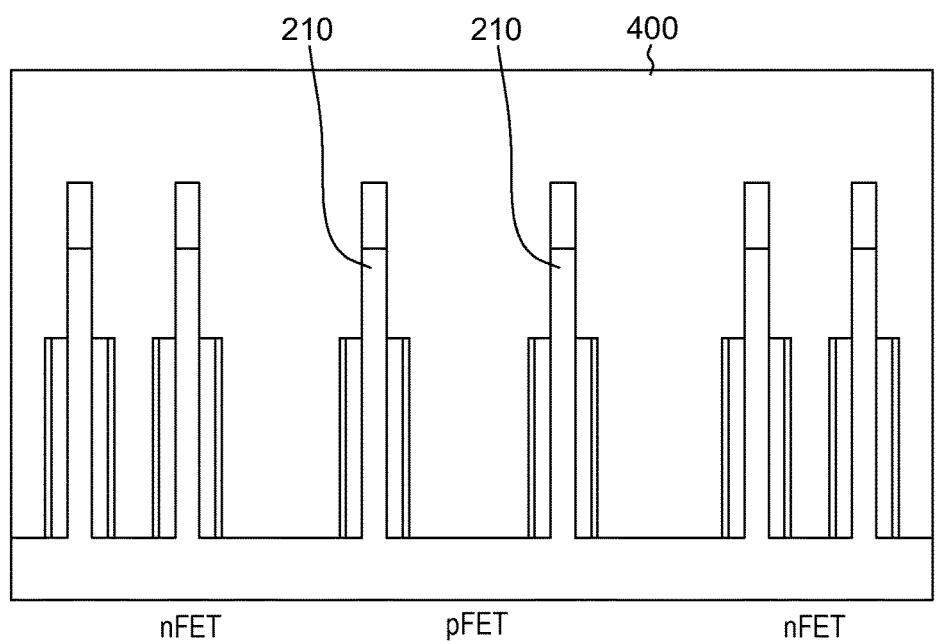
Figure 7:
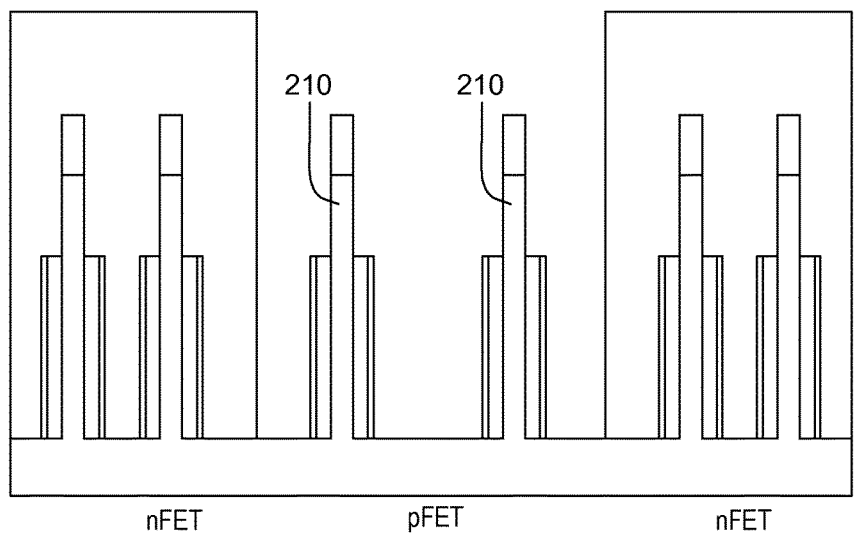
Figure 8:
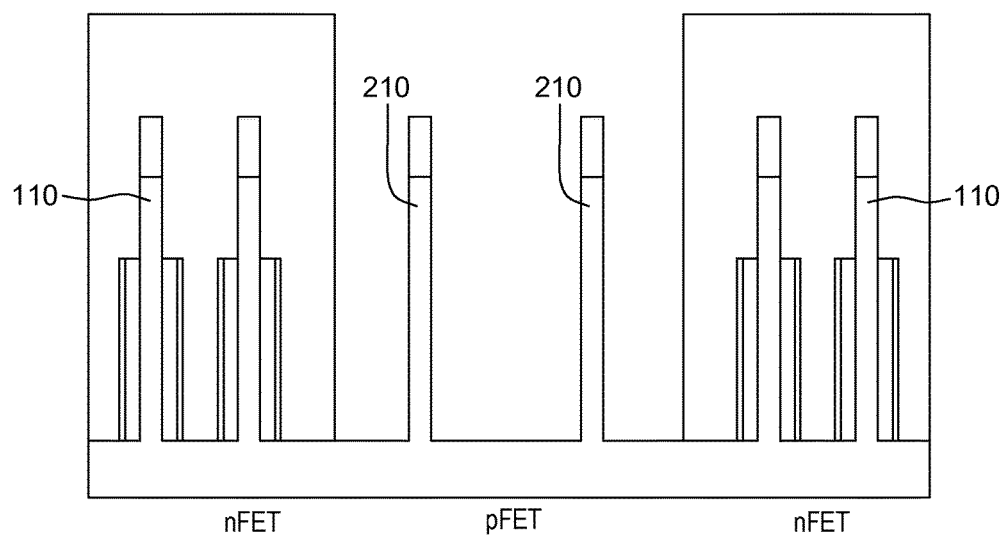

With reference to FIGS. 6-8, n-well patterning may be employed for further processing the second plurality of fins 120 for use in forming pFETs. For example, application of a blocking material may be used for selectively exposing the second plurality of fins. With reference to FIG. 6, a blocking material 400 is deposited over the intermediate structure of FIG. 5. The blocking material may include an organic planarizing layer, an amorphous carbon layer, or other suitable blocking material. Patterned portions of blocking material 400 are removed to expose the second plurality of fins 210 with the first at least one dielectric material disposed on lower portions thereof, as shown in FIG. 7. For example, a lithography process may be performed by, for example, depositing a photoresist layer over the intermediate structure of FIG. 6 and patterning the intermediate structure to form the open portions. As shown in FIG. 8, the first at least one dielectric material is stripped or removed from second plurality of fins 210 to expose the lower portions of second plurality of fins 210. One or more ion implantation processes through the opened portions of the patterned blocking material may be employed using an appropriate dopant material to implant the desired dopant material into the substrate. The remaining patterned portions of the blocking material disposed over the first plurality of fins 110 may then be stripped or removed resulting in the intermediate structure shown in FIG. 9.

Figure 9:
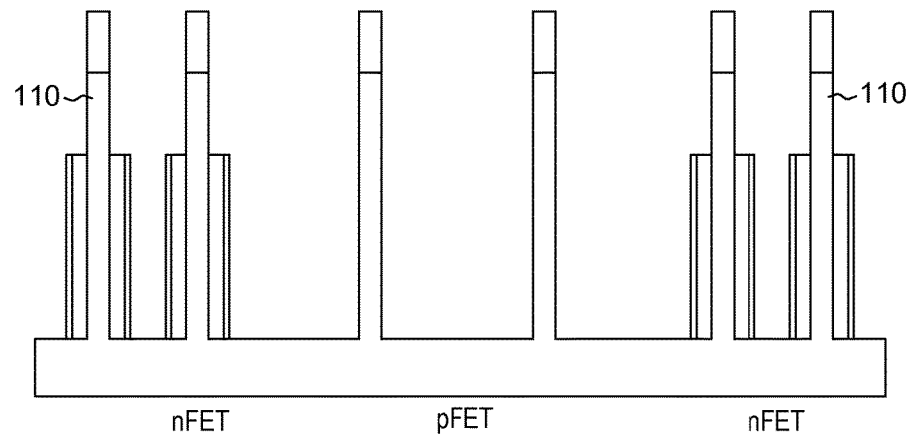
Figure 10:
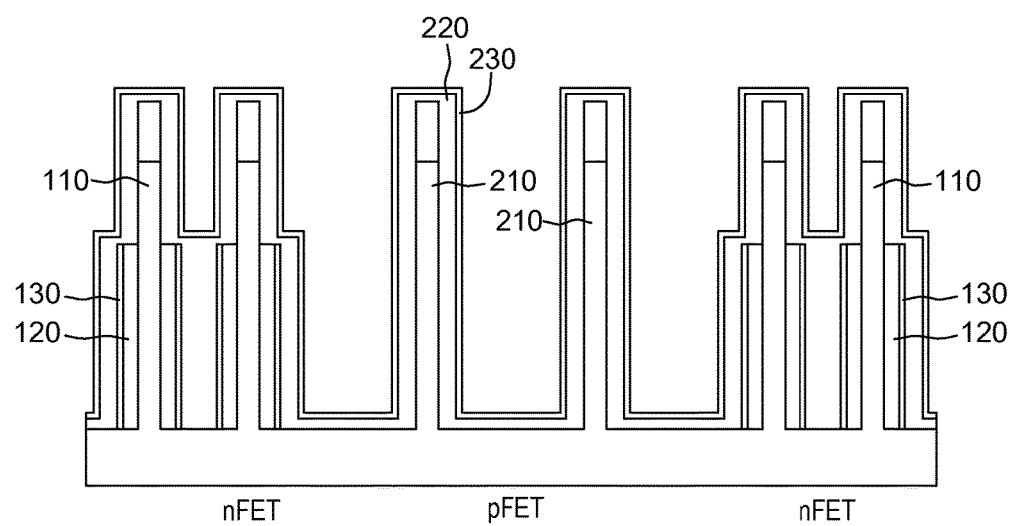
Figure 11:
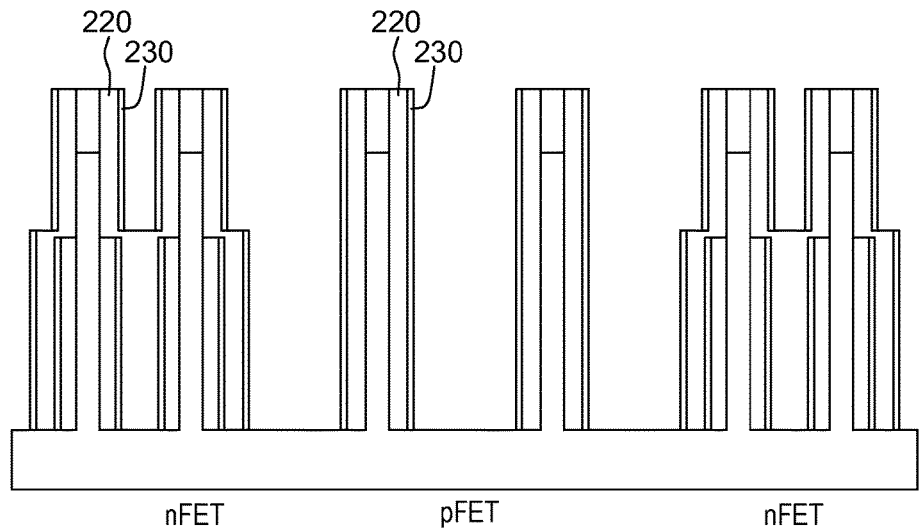

With reference to FIGS. 10 and 11, a second at least one dielectric material may be disposed over the intermediate structure of FIG. 9. The second at least one dielectric material may be different from the first at least one dielectric material. For example, the second at least one dielectric material may include a first dielectric material 220 may be disposed over first plurality of fins 110, e.g., over the upper exposed portions of first plurality of fins 110 and over the first at least one dielectric material (e.g., dielectric materials 120 and 130) disposed over the lower portions of the first plurality of fins. In addition, first dielectric material 220 may be disposed over the second plurality of fins, e.g., over the exposed lower and upper portions of the second plurality of fins 210. A spacer or second dielectric material 230 may be disposed over first dielectric material 220. First dielectric material 220 may be deposited by chemical vapor deposition (CVD). First dielectric material 220 may be a phosphate silicate glass (PSG) or other suitable material. The spacer material 230 may be applied over the exposed first dielectric material 220, by for example, atomic layer deposition (ALD). The spacer material may be made of, for example, silicon nitride (SiN). As shown in FIG. 11, the second at least one dielectric material may be etched back, e.g., the horizontal tops and bottoms removed.

Figure 12:
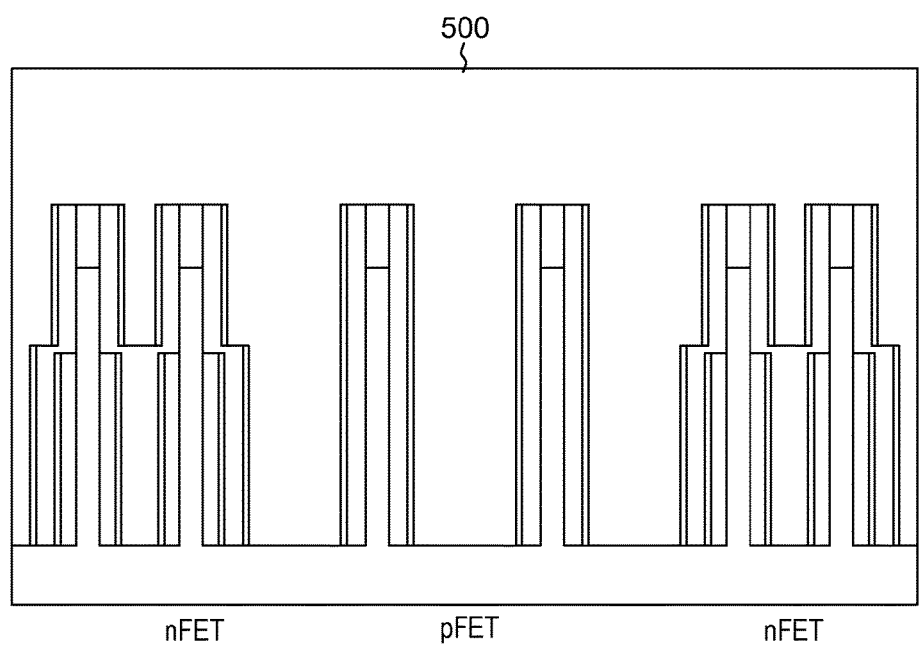
Figure 13:
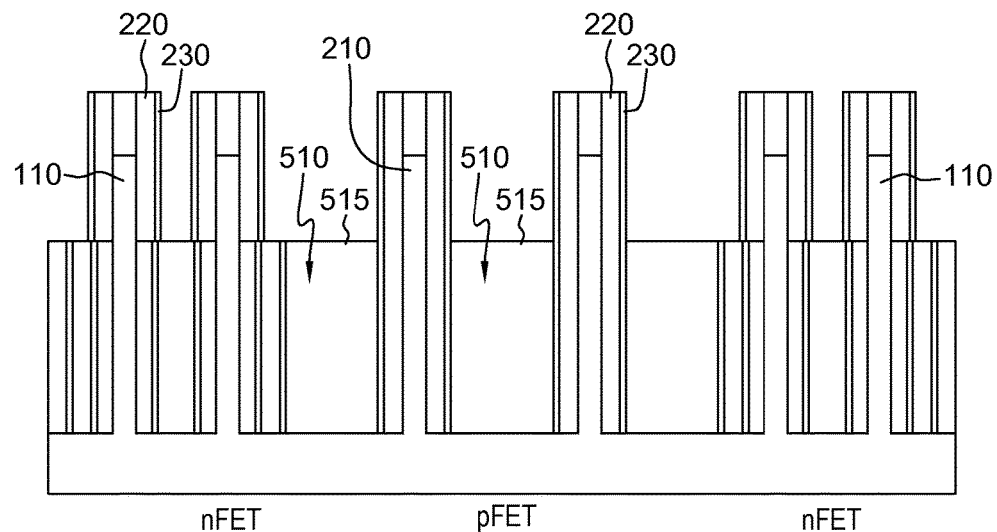
Figure 14:
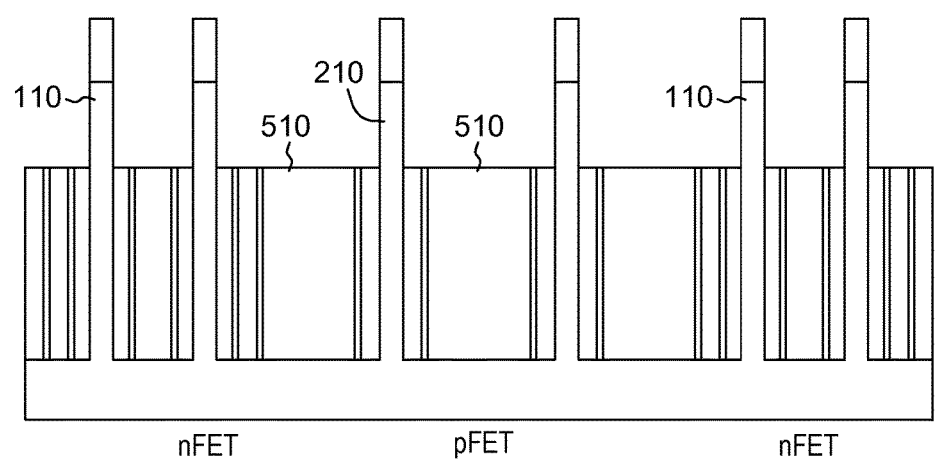

With reference to FIGS. 12-14, application of a readily applied and removed blocking material may be used for selectively exposing upper portions of the first plurality of fins and the second plurality of fins. For example, as shown in FIG. 12, a blocking material 500 may deposited over and cover the intermediate structure of FIG. 11. The blocking material may include an organic planarizing layer, an amorphous carbon layer, or other suitable material. Thereafter, as shown in FIG. 13, an upper portion of the blocking material may be etched back or removed leaving lower portions 510 of the blocking material and revealing or exposing upper portions of the first plurality and the second plurality of fins 110 and 120 with the second at least one dielectric material (e.g., dielectric material 220 and 230) at a desired height extending above lower portions 510 of the remaining blocking material. For example, the upper portions of the blocking material may be removed by etching. The upper surface 515 of remaining lower portions 510 of blocking material 500 (FIG. 12) may correspond to the upper surface of lower portions 310 (FIG. 3) of blocking material 300 (FIG. 2) and generally correspond closely to the bottom of the final exposed fin height for use in forming the nFETs and pFETs. The exposed upper portions of the second at least one dielectric materials, e.g., dielectric material 220 and dielectric material 230, disposed above the lower portion of the remaining blocking material 510 are removed as shown in FIG. 14 to expose upper portions of the first and second plurality of fins 110 and 120. For example, removal of the second at least one dielectric materials by be performed by a SiConi™ etch back process or processes, or other suitable process. Thereafter, the remaining or lower portions 510 of blocking material are stripped or removed as shown in FIG. 15, for example, by etching.

Figure 15:
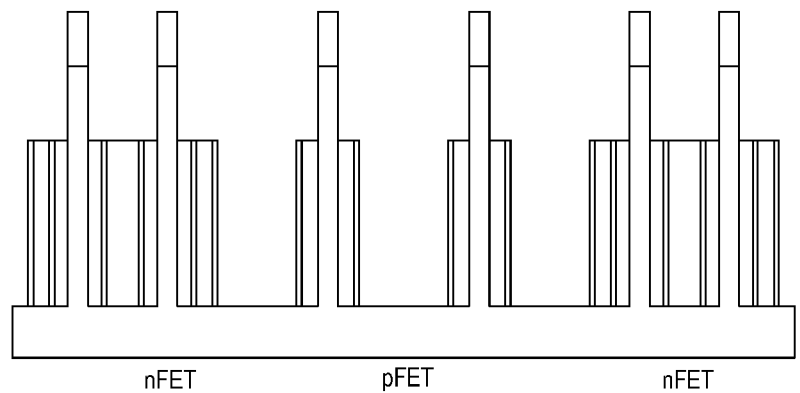
Figure 16:
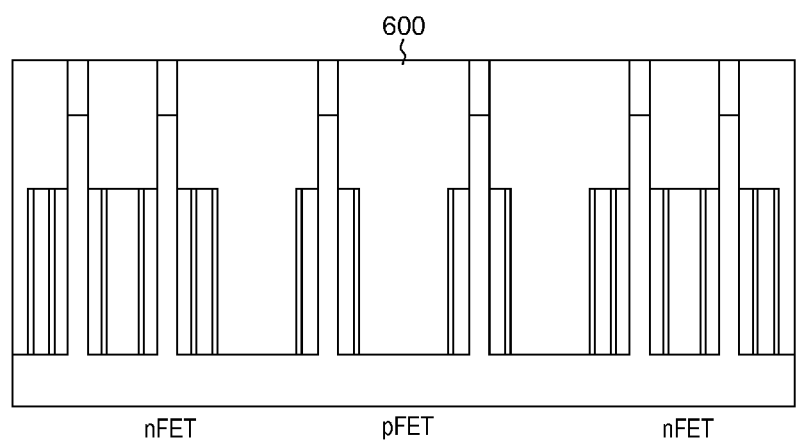
Figure 17:
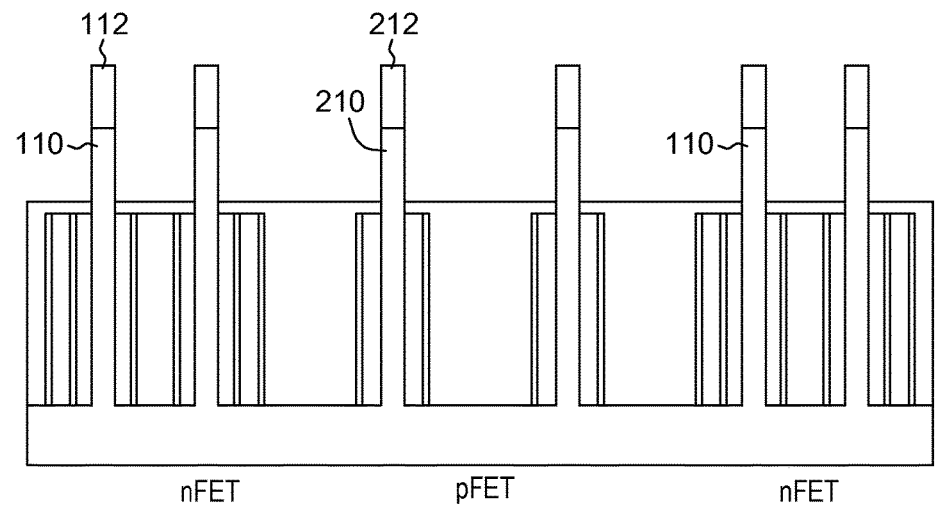
Figure 18:
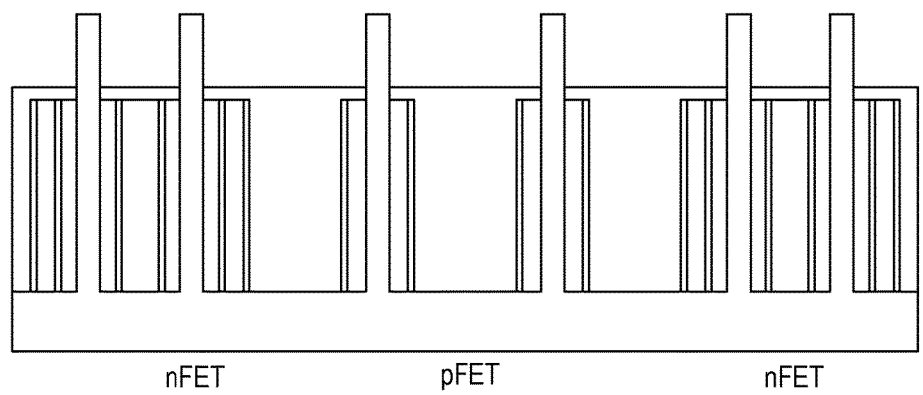

With reference to FIG. 16, an interlayer dielectric (ILD) material 600 may then be deposited over the intermediate structure of FIG. 15. The ILD material may be a SiO2 material. An upper portion of the ILD is removed or etched back to expose the upper portions of the plurality of fins 110 and 210 as shown in FIG. 17. For example, the ILD material may be removed using a plasma etch, a wet etch, a SiConi™, a COR™, or combination of two or more of these process or other suitable process. As shown in FIGS. 17 and 18, an upper portion of ILD material may extend over the first at least one dielectric material and the second at least one dielectric material. Thereafter, hard masks 112 and 212 may be removed or etched back from the plurality of fins 120 and 220 to for the intermediate structured as shown in FIG. 18 for use in nFETs and pFETs.

Figure 19:
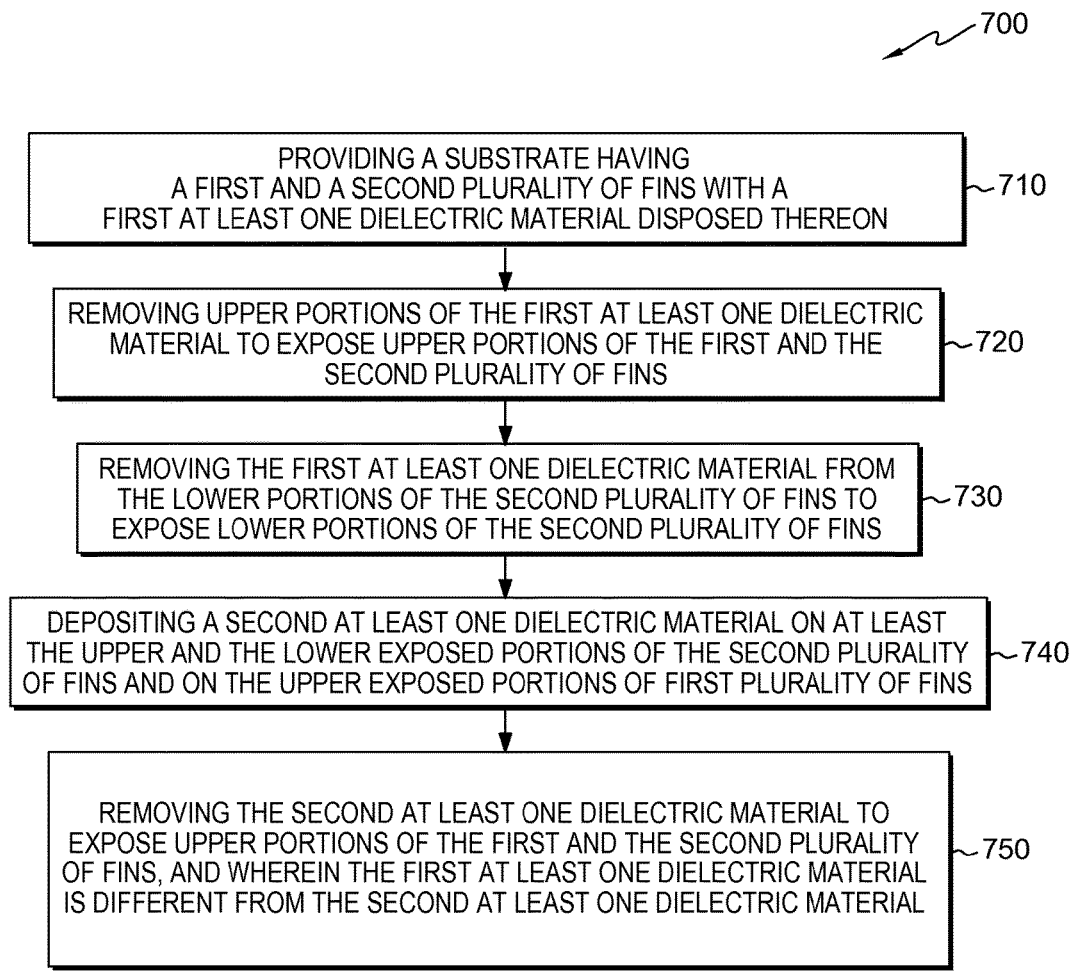
FIG. 19 is a flowchart illustrating a method for use in forming an intermediate semiconductor structure in accordance with aspects of the present disclosure.

FIG. 19 is a flowchart of a method 700 for use in forming an intermediate semiconductor substrate. The method includes at 710, providing a substrate having a first and a second plurality of fins with a first at least one dielectric material disposed thereon. At 720, upper portions of the first at least one dielectric material are removed to expose upper portions of the first and the second plurality of fins. At 730, the first at least one dielectric material is removed from the lower portions of the second plurality of fins to expose lower portions of the second plurality of fins. At 740, a second at least one dielectric material is disposed on at least the upper and the lower exposed portions of the second plurality of fins and on the upper exposed portions of first plurality of fins. At 750, the second at least one dielectric material is removed to expose upper portions of the first plurality of fins and the second plurality of fins and wherein the first at least one dielectric material is different from the second at least one dielectric material.

Figure 20:
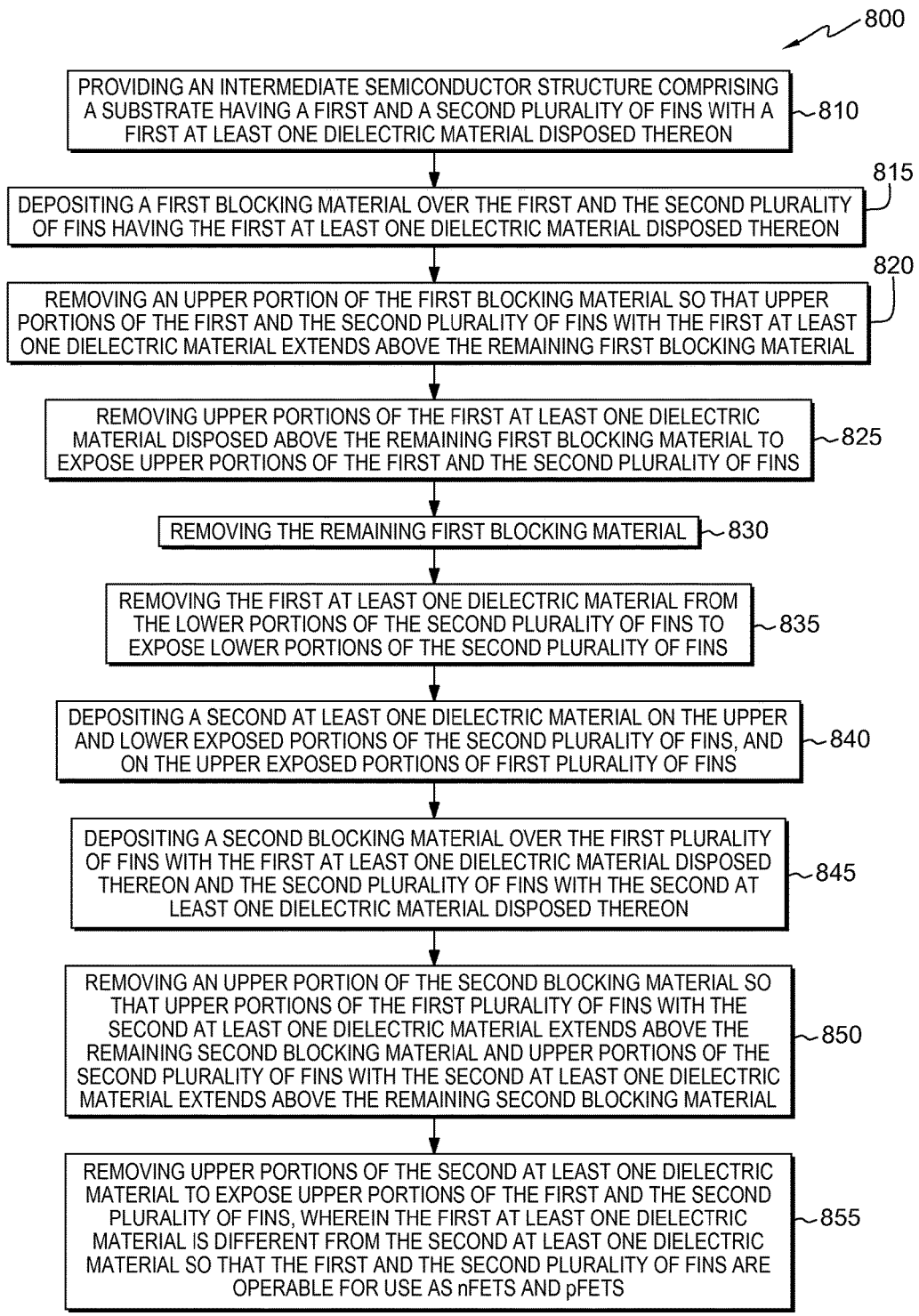
FIG. 20 is a flowchart illustrating a method for use in forming a plurality of fins for nFETs and pFETs in accordance with aspects of the present disclosure.

FIG. 20 is a flowchart of another method 800 for use in forming a plurality of fins for nFETs and pFETs. The method includes at 810, providing an intermediate semiconductor structure having a substrate having a first and a second plurality of fins with a first at least one dielectric material disposed thereon, at 815, depositing a first blocking material over the first and the second plurality of fins having the first at least one dielectric material disposed thereon, and at 820, removing an upper portion of the first blocking material so that upper portions of the first and the second plurality of fins with the first at least one dielectric material extends above the remaining first blocking material. At 825, upper portions of the first at least one dielectric material disposed above the remaining first blocking material is removed to expose upper portions of the first and the second plurality of fins, at 830 the remaining first blocking material is removed, and at 835, the first at least one dielectric material from the lower portions of the second plurality of fins is removed to expose lower portions of the second plurality of fins. At 840, a second at least one dielectric material is deposited on the upper and lower exposed portions of the second plurality of fins, and on the upper exposed portions of first plurality of fins, and at 845, a second blocking material is deposited over the first plurality of fins with the first at least one dielectric material disposed thereon and the second plurality of fins with the second at least one dielectric material disposed thereon. At 850, an upper portion of the second blocking material is removed so that upper portions of the first plurality of fins with the second at least one dielectric material extends above the remaining second blocking material and upper portions of the second plurality of fins with the second at least one dielectric material extends above the remaining second blocking material. At 855, upper portions of the second at least one dielectric material are removed to expose upper portions of the first and the second plurality of fins, wherein the first at least one dielectric material is different from the second at least one dielectric material so that the first and second plurality of fins are operable for use as the nFETs and the pFETs.

From the present disclosure, it will be appreciated that employing two blocking materials, e.g. blocking materials 400 and 500, with the selective removal of upper portions thereof such as etch back may allow for fabrication of nFETs and pFETs with a single patterning employing a mask. For example, as noted above, etch back processes may be employed in FIGS. 3 and 13, with a lithographic patterning process may be employed in FIG. 7. Such a process using a first and a second blocking materials with the selective removal or etching of upper portions thereof may avoid the need for using two expensive lithographic patterning process employing a mask for fabrication of nFETs and pFETs. In addition, for such a technique of the present disclose also results in avoiding pinch-off at or between tight pitched fins.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of one or more aspects of the present disclosure and the practical application, and to enable others of ordinary skill in the art to understand one or more aspects of the disclosure for various embodiments with various modifications as are suited to the particular use contemplated.

The invention claimed is:

1. A method for forming an intermediate semiconductor structure, the method comprising:
   providing a substrate having a first and a second plurality of fins with a first at least one dielectric material disposed thereon;
   removing upper portions of the first at least one dielectric material to expose upper portions of the first and the second plurality of fins comprising:
      depositing a first blocking material over the first and second plurality of fins having the first at least one dielectric material disposed thereon;
      removing an upper portion of the first blocking material so that upper portions of the first and second plurality of fins with the first least one dielectric material extends above the remaining first blocking material;
      removing upper portions of the first at least one dielectric material disposed above the remaining first blocking material to expose upper portions of the first and second plurality of fins; and
      removing the remaining first blocking material;
   removing the first at least one dielectric material from the lower portions of the second plurality of fins to expose lower portions of the second plurality of fins;
   depositing a second at least one dielectric material on at least the upper and the lower exposed portions of the second plurality of fins and on the upper exposed portions of first plurality of fins;
   removing the second at least one dielectric material to expose upper portions of the first and the second plurality of fins; and
   wherein the first at least one dielectric material is different from the second at least one dielectric material.

2. The method of claim 1 wherein an upper surface of the remaining first blocking material corresponds generally to the bottom of the resulting exposed portions of the first plurality of fins and the second plurality of fins.

3. The method of claim 1 wherein the first blocking material comprises organic planarizing layer or an amorphous carbon layer.

4. The method of claim 1 wherein removing the first at least one dielectric material from the lower portions of the second plurality of fins to expose lower portions of the second plurality of fins comprises:
   patterning with a mask to open the second plurality of fins.

5. The method of claim 4 wherein the removing the second at least one dielectric material to expose upper portions of the first and second plurality of fins comprises:
   depositing a second blocking material over the first plurality of fins with the first at least one dielectric material disposed thereon and the second plurality of fins with the second at least one dielectric material disposed thereon;
   removing an upper portion of the second blocking material so that upper portions of the first plurality of fins with the second at least one dielectric material extends above the remaining second blocking material and upper portions of the second plurality of fins with the second at least one dielectric material extends above the remaining second blocking material; and
   removing upper portions of the second at least one dielectric material above the remaining second blocking material to expose upper portions of the first and second plurality of fins.

6. The method of claim 4 wherein the first blocking material comprises an organic planarizing layer or an amorphous carbon layer.

7. The method of claim 6 wherein an upper surface of the remaining second blocking material corresponding generally to the upper surface of the remaining first blocking material and generally to the bottom of the resulting exposed portions of the fins.

8. The method of claim 1 wherein the first and the second plurality of fins are operable for use as nFETs and pFETs.

9. A method for forming an intermediate semiconductor structure, the method comprising:
   providing a substrate having a first and a second plurality of fins with a first at least one dielectric material disposed thereon;
   removing upper portions of the first at least one dielectric material to expose upper portions of the first and the second plurality of fins;
   removing the first at least one dielectric material from the lower portions of the second plurality of fins to expose lower portions of the second plurality of fins;
   depositing a second at least one dielectric material on at least the upper and the lower exposed portions of the second plurality of fins and on the upper exposed portions of first plurality of fins;
   removing the second at least one dielectric material to expose upper portions of the first and the second plurality of fins;
   wherein the first at least one dielectric material is different from the second at least one dielectric material; and
   wherein the first at least one dielectric material comprises boron silicate glass, and the second at least one dielectric material comprises phosphorus silicate glass.

10. The method of claim 9 wherein the first at least one dielectric material comprises the boron silicate glass and silicon nitride, and the second at least one dielectric material comprises the phosphorus silicate glass and silicon nitride.

11. The method of claim 9 wherein the removing upper portions of the first at least one dielectric material to expose upper portions of the first plurality of fins and the second plurality of fins comprises:
- depositing a first blocking material over the first and second plurality of fins having the first at least one dielectric material disposed thereon;
- removing an upper portion of the first blocking material so that upper portions of the first and second plurality of fins with the first least one dielectric material extends above the remaining first blocking material;
- removing upper portions of the first at least one dielectric material disposed above the remaining first blocking material to expose upper portions of the first and second plurality of fins; and
- removing the remaining first blocking material.

12. The method of claim 11 wherein an upper surface of the remaining first blocking material corresponds generally to the bottom of the resulting exposed portions of the first plurality of fins and the second plurality of fins.

13. The method of claim 11 wherein the first blocking material comprises organic planarizing layer or an amorphous carbon layer.

14. The method of claim 11 wherein removing the first at least one dielectric material from the lower portions of the second plurality of fins to expose lower portions of the second plurality of fins comprises:
- patterning with a mask to open the second plurality of fins.

15. The method of claim 14 wherein the removing the second at least one dielectric material to expose upper portions of the first and second plurality of fins comprises:
- depositing a second blocking material over the first plurality of fins with the first at least one dielectric material disposed thereon and the second plurality of fins with the second at least one dielectric material disposed thereon;
- removing an upper portion of the second blocking material so that upper portions of the first plurality of fins with the second at least one dielectric material extends above the remaining second blocking material and upper portions of the second plurality of fins with the second at least one dielectric material extends above the remaining second blocking material; and
- removing upper portions of the second at least one dielectric material above the remaining second blocking material to expose upper portions of the first and second plurality of fins.

16. The method of claim 14 wherein the first blocking material comprises an organic planarizing layer or an amorphous carbon layer.

17. The method of claim 16 wherein an upper surface of the remaining second blocking material corresponding generally to the upper surface of the remaining first blocking material and generally to the bottom of the resulting exposed portions of the fins.

18. The method of claim 9 wherein the first and the second plurality of fins are operable for use as nFETs and pFETs.

* * * * *